(12) United States Patent
Peterson et al.

(10) Patent No.: US 11,533,807 B2
(45) Date of Patent: Dec. 20, 2022

(54) INTEGRAL FEATURES PROVIDING IMPROVED FLEXIBLE PRINTED CIRCUIT FOLDING AND CONNECTION CAPABILITY

(71) Applicant: APTIV TECHNOLOGIES LIMITED, St. Michael (BB)

(72) Inventors: David R. Peterson, Aurora, OH (US); Joseph Sudik, Jr., Niles, OH (US); David G. Siegfried, Warren, OH (US); Jared Bilas, North Bloomfield, OH (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 29 days.

(21) Appl. No.: 17/120,416

(22) Filed: Dec. 14, 2020

(65) Prior Publication Data
US 2021/0212195 A1    Jul. 8, 2021

Related U.S. Application Data

(60) Provisional application No. 62/956,855, filed on Jan. 3, 2020.

(51) Int. Cl.
*H05K 1/02* (2006.01)
*H05K 3/00* (2006.01)

(52) U.S. Cl.
CPC ........... *H05K 1/028* (2013.01); *H05K 3/0032* (2013.01); *H05K 2201/052* (2013.01);
(Continued)

(58) Field of Classification Search
CPC ...... H05K 1/189; H05K 1/028; H05K 1/1026; H05K 3/0032; H05K 2201/052; H05K 2201/055; H05K 2201/09036; H05K 2201/09063; H05K 2201/09236; H05K 2201/09936; H05K 2203/107; H05K 1/118; H05K 1/0266; H05K 2201/0906; H05K 2201/2036; H05K 2201/2027; H05K 2201/10356; H05K 2201/10409; H05K 2201/056; B60R 16/0215
See application file for complete search history.

(56) References Cited

U.S. PATENT DOCUMENTS

| | | | | |
|---|---|---|---|---|
| 5,262,590 A | * | 11/1993 | Lia | H05K 1/0218 174/268 |
| 2003/0024913 A1 | * | 2/2003 | Downes | H05K 1/0266 219/121.68 |

(Continued)

*Primary Examiner* — Roshn K Varghese
(74) *Attorney, Agent, or Firm* — RMCK Law Group, PLC

(57) ABSTRACT

A flexible circuit (FC) and a method of forming the FC each include providing a first dielectric layer, applying a plurality of conductive circuit traces that are substantially parallel to each other to the first dielectric layer, providing a second dielectric layer atop the first dielectric layer and the plurality of conductive circuit traces to form a third dielectric layer having the plurality of conductive traces disposed therein and being configured to support and insulate the plurality of conductive traces, and forming a plurality of channels extending at least partially through a thickness of the third dielectric layer, wherein the plurality of channels are arranged between the plurality of conductive circuit traces and substantially parallel thereto and are configured to provide increased flexibility of the FC.

20 Claims, 5 Drawing Sheets

(52) U.S. Cl.
CPC .............. *H05K 2201/09036* (2013.01); *H05K 2201/09063* (2013.01); *H05K 2201/09236* (2013.01); *H05K 2201/09936* (2013.01); *H05K 2203/107* (2013.01)

(56) References Cited

U.S. PATENT DOCUMENTS

2014/0174796 A1* 6/2014 Watanabe ............ H05K 1/0266
174/254
2014/0354900 A1* 12/2014 Qian ..................... H05K 1/028
174/254

* cited by examiner

INTEGRAL FEATURES PROVIDING IMPROVED FLEXIBLE PRINTED CIRCUIT FOLDING AND CONNECTION CAPABILITY

CROSS-REFERENCE TO RELATED APPLICATION(S)

The present application claims the benefit of U.S. Provisional Application No. 62/956,855, filed on Jan. 3, 2020. The disclosure of this application is incorporated herein by reference in its entirety.

FIELD

The present disclosure generally relates to automotive electrical systems and, more particularly, to improved flexible circuits (FCs) having integral features for folding and connection capability.

BACKGROUND

A flexible circuit (FC) is an electronic circuit formed by mounting electronic elements (e.g., conductive circuit traces) on a flexible substrate. The flexibility of conventional FCs is limited by their materials and their dimensions (e.g., thicknesses). More flexible FCs would be desirable for applications having very small or limited packaging space, such as a vehicle (and in particular, an autonomous electrified vehicle). Accordingly, while conventional FCs work well for their intended purpose, an opportunity exists for improvement in the art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a flexible circuit (FC) is presented. In one exemplary implementation, the FC comprises: a plurality of conductive circuit traces that are substantially parallel to each other, and a dielectric layer: having the plurality of conductive circuit traces disposed therein, being configured to support and insulate the plurality of conductive circuit traces, and defining a plurality of channels extending at least partially through a thickness of the dielectric layer, wherein the plurality of channels are arranged between the plurality of conductive circuit traces and substantially parallel thereto and are configured to provide increased flexibility of the FC.

In some implementations, at least some of the plurality of channels extend fully through the thickness of the dielectric layer. In some implementations, all of the plurality of channels extend fully through the thickness of the dielectric layer. In some implementations, at least some of the plurality of channels are discontinuous. In some implementations, a discontinuity of the at least some of the plurality of channels corresponds to a perforation pattern to provide for improved folding of the FC. In some implementations, a discontinuity of the at least some of the plurality of channels provides increased support or strength of the FC.

In some implementations, at least some of the plurality of channels are formed by laser processing. In some implementations, all of the plurality of channels are formed by laser processing. In some implementations, the laser processing further comprises defining an identifier in a surface of the dielectric layer, and the identifier identifies at least one of a type of the FC and an installation location for the FC. In some implementations, at least some of the plurality of conductive circuit traces are formed of copper or aluminum.

According to another aspect of the present disclosure, a method of forming an FC is presented. In one exemplary implementation, the method comprises: providing a first dielectric layer, applying a plurality of conductive circuit traces that are substantially parallel to each other to the first dielectric layer, providing a second dielectric layer atop the first dielectric layer and the plurality of conductive circuit traces to form a third dielectric layer having the plurality of conductive traces disposed therein and being configured to support and insulate the plurality of conductive traces, and forming a plurality of channels extending at least partially through a thickness of the third dielectric layer, wherein the plurality of channels are arranged between the plurality of conductive circuit traces and substantially parallel thereto and are configured to provide increased flexibility of the FC.

In some implementations, at least some of the plurality of channels extend fully through the thickness of the third dielectric layer. In some implementations, all of the plurality of channels extend fully through the thickness of the third dielectric layer. In some implementations, at least some of the plurality of channels are discontinuous. In some implementations, a discontinuity of the at least some of the plurality of channels corresponds to a perforation pattern to provide for improved folding of the FC. In some implementations, a discontinuity of the at least some of the plurality of channels provides increased support or strength of the FC.

In some implementations, at least some of the plurality of channels are formed by laser processing. In some implementations, all of the plurality of channels are formed by laser processing. In some implementations, the laser processing further comprises defining an identifier in a surface of the third dielectric layer, and the identifier identifies at least one of a type of the FC and an installation location for the FC.

According to yet another aspect of the present disclosure, an FC is presented. In one exemplary implementation, the FC comprises a plurality of conductive circuit trace means that are substantially parallel to each other, and a dielectric layer means for having the plurality of conductive circuit trace means disposed therein, supporting and insulating the plurality of conductive circuit trace means, and defining a plurality of channel means extending at least partially through a thickness of the dielectric layer means, wherein the plurality of channel means are arranged between the plurality of conductive circuit trace means and substantially parallel thereto and are configured to provide increased flexibility of the FC.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1A:
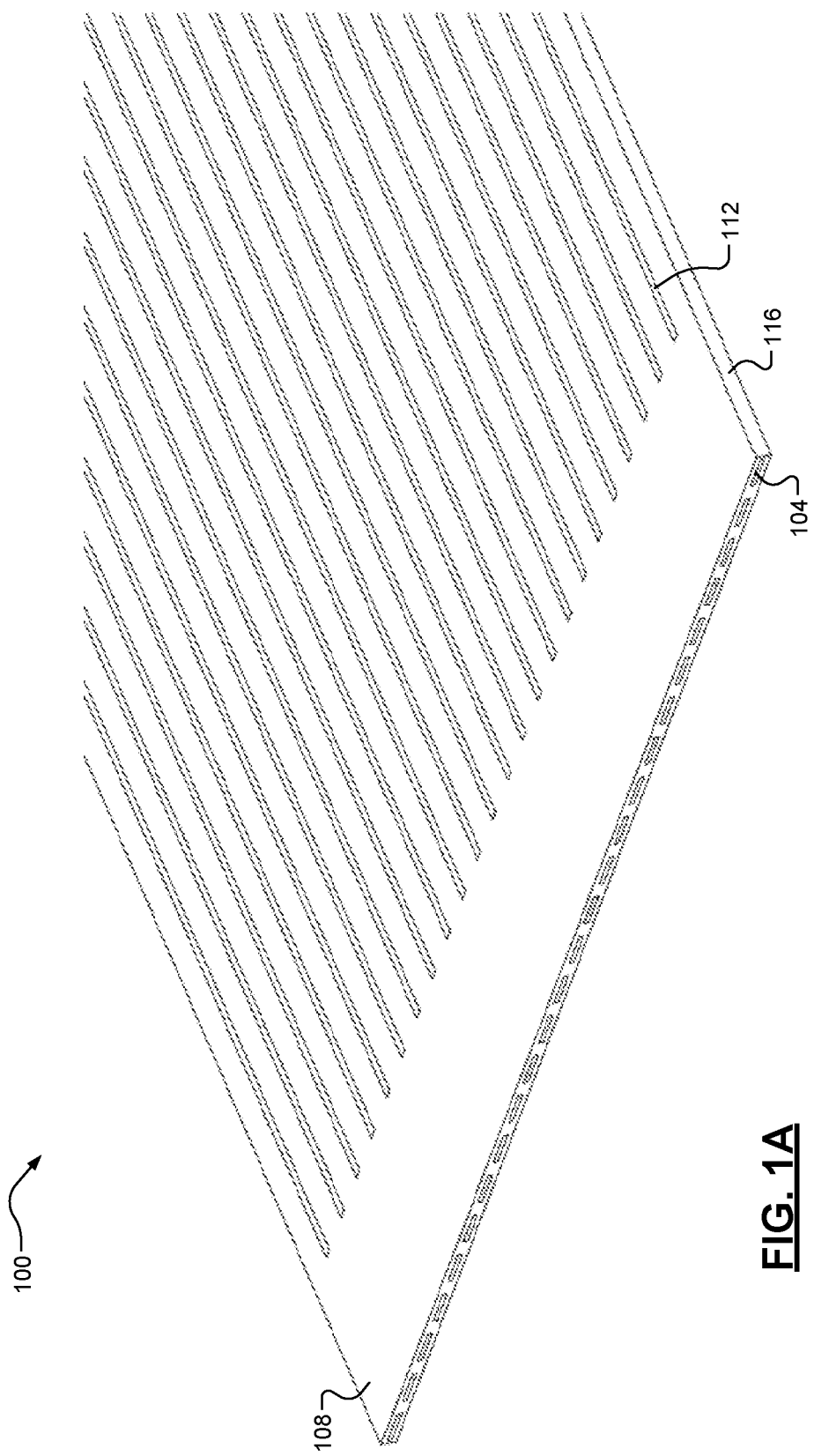
FIGS. 1A-1B illustrate views of a first example flexible circuit (FC) according to some implementations of the present disclosure.
Figure 1B:
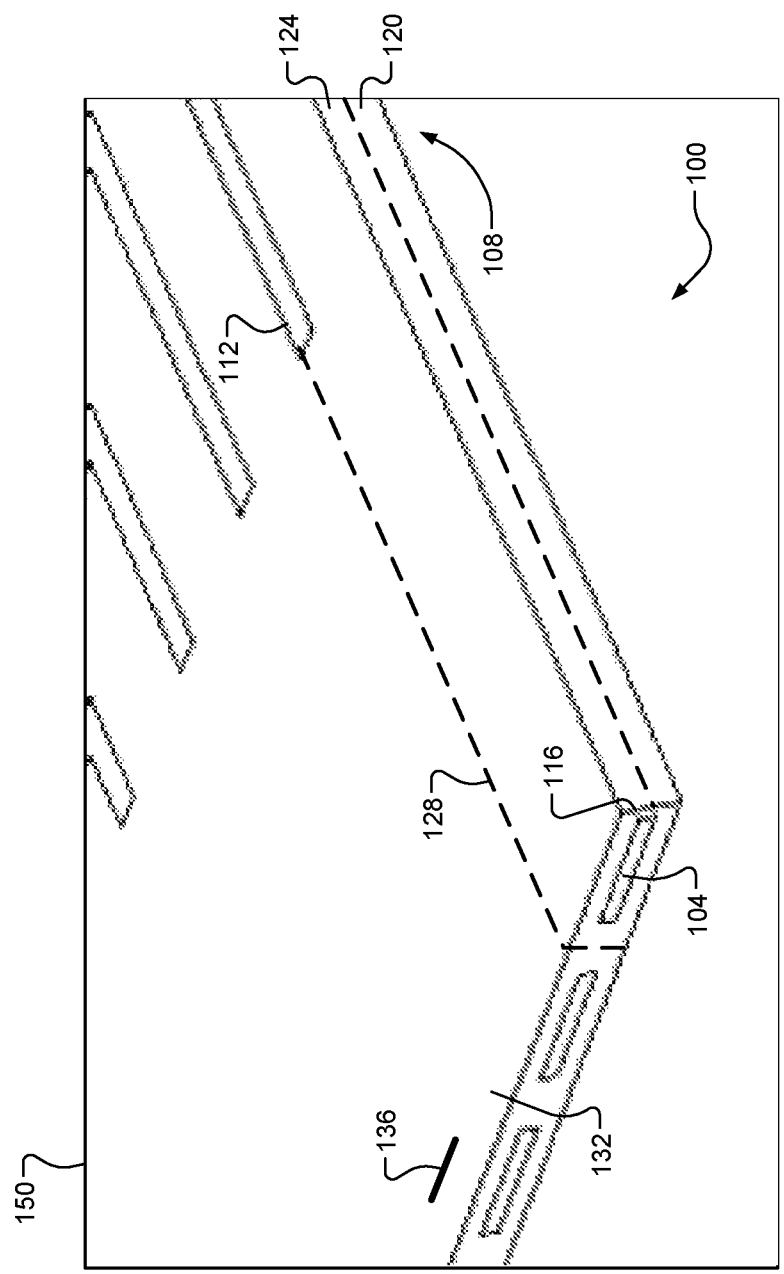

Referring now to FIGS. 1A-1B, an example flexible circuit (FC) 100 (including a zoomed-in portion 150) according to some implementations of the present disclosure is illustrated. The FC 100 comprises a plurality of distinct (singulated) conductive circuit traces 104 that are substantially parallel to each other. Each conductive circuit trace 104 is formed of a conductive material that should be lightweight and flexible (i.e., non-brittle) material, while also providing good conductive properties. Non-limiting examples of the conductive material include copper and aluminum and conductive inks. The plurality of conductive circuit traces 104 could be applied using any suitable deposition process, including, but not limited to, deposition processes (physical/chemical vapor deposition, sputtering, etc.) and printing processes (screen printing, lithography, inkjet, etc.). While flexible printed circuits (FPCs) are primarily discussed and shown herein, it will be appreciated that the present disclosure is directed to any type of FC. The conductive circuit traces illustrated here have a generally rectangular cross-section, but other embodiments wherein the conductive circuit traces have round, oval, square or other cross-sectional shapes may also be envisioned. A dielectric layer 108 has the plurality of conductive circuit traces 104 disposed therein such that the dielectric layer 108 supports and insulates (e.g., protects) the plurality of conductive circuit traces 104. The dielectric layer 108 also defines a thickness 116. The dielectric layer 108 could be formed using any suitable process, including, but not limited to, injection molding (e.g., multi-shot injection molding). While a single dielectric layer 108 illustrated, it will be appreciated that the dielectric layer 108 could be collectively formed of a plurality of dielectric sub-layers (e.g., dielectric sub-layers 120 and 124), which could be formed at different times during processing of the FC 100 and could be made of the same or different materials. In one exemplary implementation, the dielectric layer 108 has an adhesive applied to one or more of its surfaces such that it can be easily attached to a surface during installation.

In one embodiment, each dielectric material is an insulating polymer (polyimide, polyamide, polyester, compounds thereof, etc.) that is flexible and non-conductive. For example only, dielectric sub-layer 120 could be initially formed and the plurality of conductive circuit traces 104 could be applied thereto, and then dielectric sub-layer 124 could be applied atop both of these to form dielectric layer 108 having the plurality of conductive circuit traces 104 disposed therein. The FC 100 also has a plurality of channels 112 extending at least partially through a thickness of the dielectric layer 108. As shown, the plurality of channels 112 are arranged between the plurality of conductive circuit traces 104 (e.g., see alignment line 128) and substantially parallel thereto. The plurality of channels 112 are configured to provide increased flexibility of the FC 100 (e.g., in a direction perpendicular to the length of the plurality of conductive circuit traces 104 and the plurality of channels 112). In one implementation, at least some of the plurality of channels 112 extend fully through a thickness 116 of the dielectric layer 108, thereby forming slots or apertures. In one implementation, all of the plurality of channels 112 extend fully through the thickness 116 of the dielectric layer 108. For a partial thickness configuration of one of the plurality of channels 112, it will be appreciated that the partial thickness channel could be defined in only one surface (e.g., top surface 132) of the dielectric layer 108 or both (top and bottom) surfaces. It will also be appreciated that the depth of the partial thickness channel could also be relatively small, which could also be described as a scoring of the surface(s) of the dielectric layer 108. Depending on the desired application for the FC 100, different channel configurations could be utilized to achieve the desired flexibility performance while also achieving desired strength properties.

Figure 2:
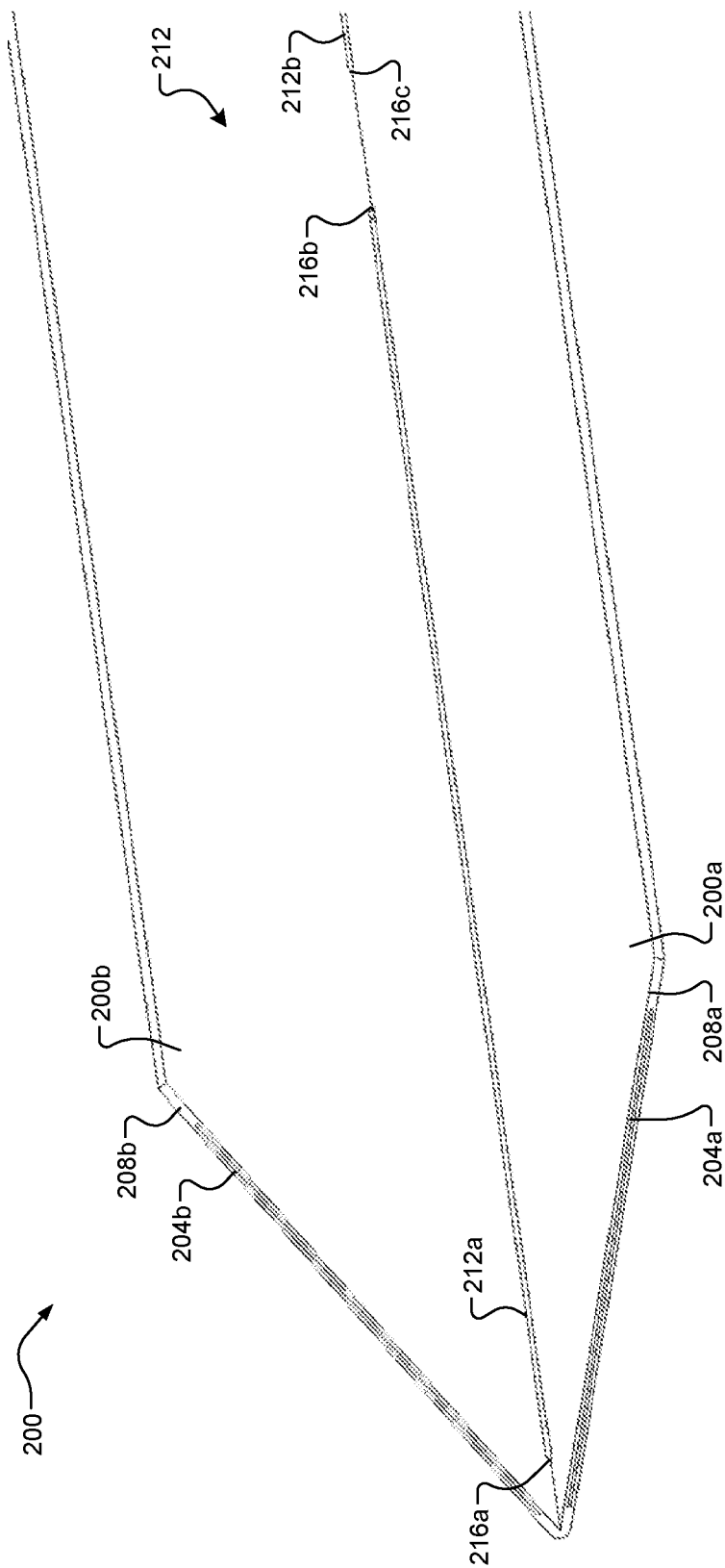
FIG. 2 illustrates a view of a second example FC according to some implementations of the present disclosure.

As shown in FIGS. 1A-1B, the plurality of channels 112 do not extend to the distal end of the FC 100. This is to both keep the FC 100 together as a single unit and to also increase the strength of the FC 100. In one implementation, at least some of the plurality of channels 112 are also discontinuous along their lengths. Referring now to FIG. 2 and with continued reference to FIGS. 1A-1B, another example FC 200 according to some implementations of the present disclosure is illustrated. The FC 200 has two portions 200a, 200b with two singulated conductive circuit traces 204a, 204b disposed within dielectric layers 208a, 208b (collectively "dielectric layer 208"), respectively. As shown, the channel 212 in the dielectric layer 208 is discontinuous in that a first portion 212a of the channel 212 starts at point 216a and terminates at point 216b. A second portion 212b of the channel 212 then starts at point 216c and continues for some finite length. This discontinuity of the channel 212 could also represent a perforation pattern, which could thereby provide for improved folding of the FC 200. In other words, by providing the channel 212 according to this perforation pattern, the foldability of the two portions 200a and 200b of the FC 200 relative to each other could be increased. This could save packaging space during both shipping and installation (e.g., into a small area of a vehicle), and could also provide for more design/installation options. In one exemplary implementation, at least some of the plurality of channels 112 and/or 212 are formed by laser processing (e.g., laser etching), but it will be appreciated that other techniques could be utilized (physical cutting, chemical etching, etc.). In one exemplary implementation, an identifier could be defined by the FC 100 or 200. In FIG. 1B, an identifier 136 is defined in the top surface 132 of the dielectric layer 108. This identifier 136 could be a barcode, quick response (QR) code, a numerical code, an alphabetical code, an alphanumerical code, or combinations thereof. The identifier could be interpreted or scanned (e.g., by a human installer or by a robotic installer) and its information could be used to identify a type of the FC 100, 200 and/or an installation location for the FC 100, 200.

Figure 3:
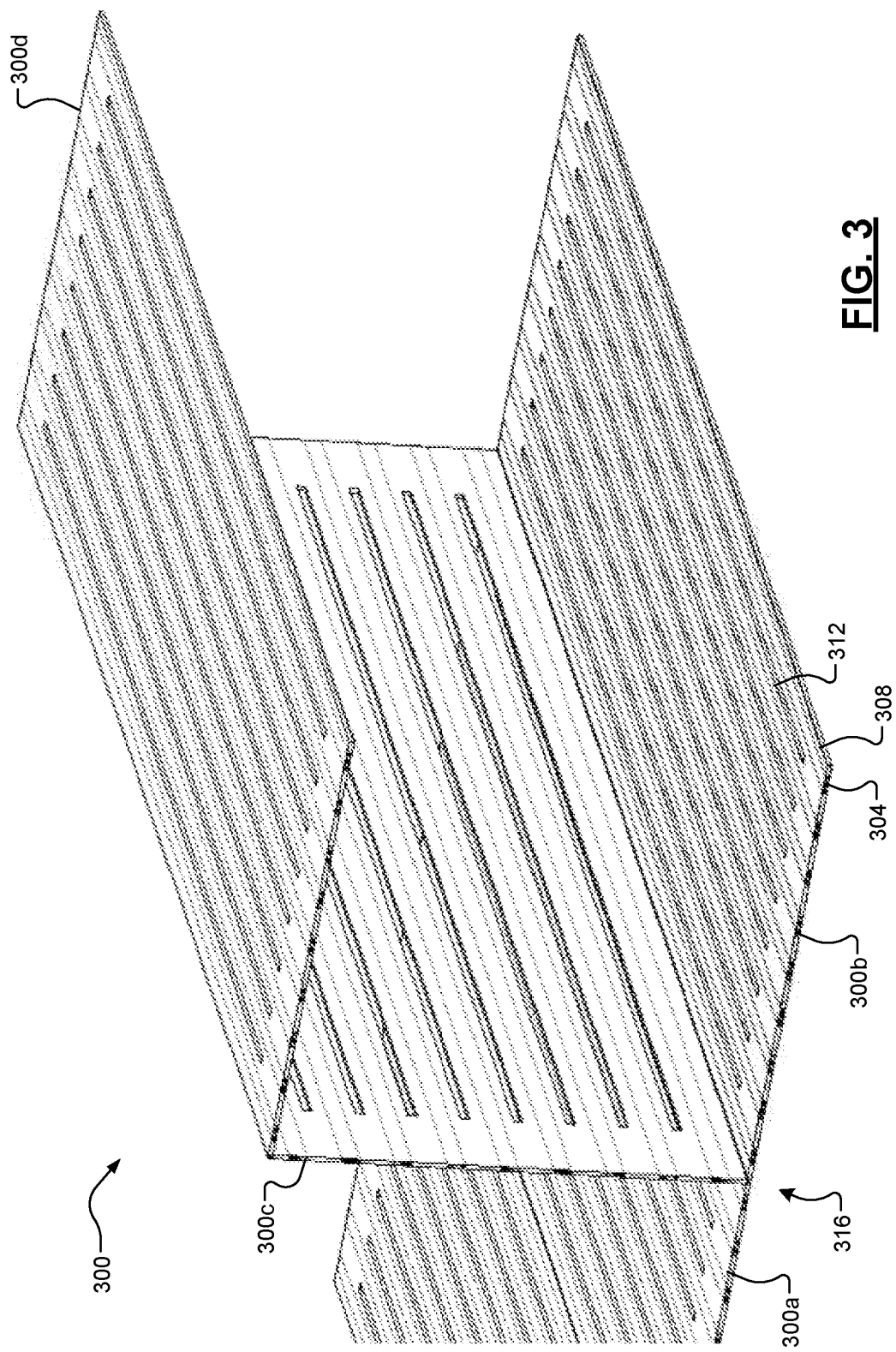
FIG. 3 illustrates a view of a third example FC according to some implementations of the present disclosure.

Referring now to FIG. 3 and with continued reference to FIGS. 1A-1B and FIG. 2, yet another example FC 300 according to some implementations of the present disclosure is illustrated. The FC 300 comprises four portions 300a, 300b, 300c, and 300d each comprising a plurality of singulated conductive circuit traces 304 disposed within a dielectric layer 308 and having a plurality of channels 312 arranged therebetween. As shown, portion 300c branches off from a point 316 between portions 300a and 300b. Portion 300d is then connected to an opposing end of portion 300c and the other end of 300*d* is free. Portions 300*a*, 300*b*, and 300*c* are all connected to each other at point 316, with the opposing ends of portions 300*a* and 300*b* also being free. This configuration could also be described as a branching or accordion-type configuration. As shown, the FC 300 could be easily folded by folding portion 300*c* onto portion 300*a* and 300*d*. Portion 300*d* could then be folded atop portion 300*c* or around portion 300*a* or 300*b* (depending on which way portion 300*c* was folded down). Whichever of portion 300*a* and 300*b* that portion 300*c* was not folded upon could then also be folded on to the other, thereby creating a four layer stack, which could create substantial packaging space savings and design/installation flexibility. This can also be described as improved perpendicular routing of the FCs 100, 200, 300 (i.e., routing not along their conductive lengths/paths). For example only, the FCs 100, 200, 300 could be wrapped around another component, such as a cylindrical pole or a rectangular box.

Figure 4:
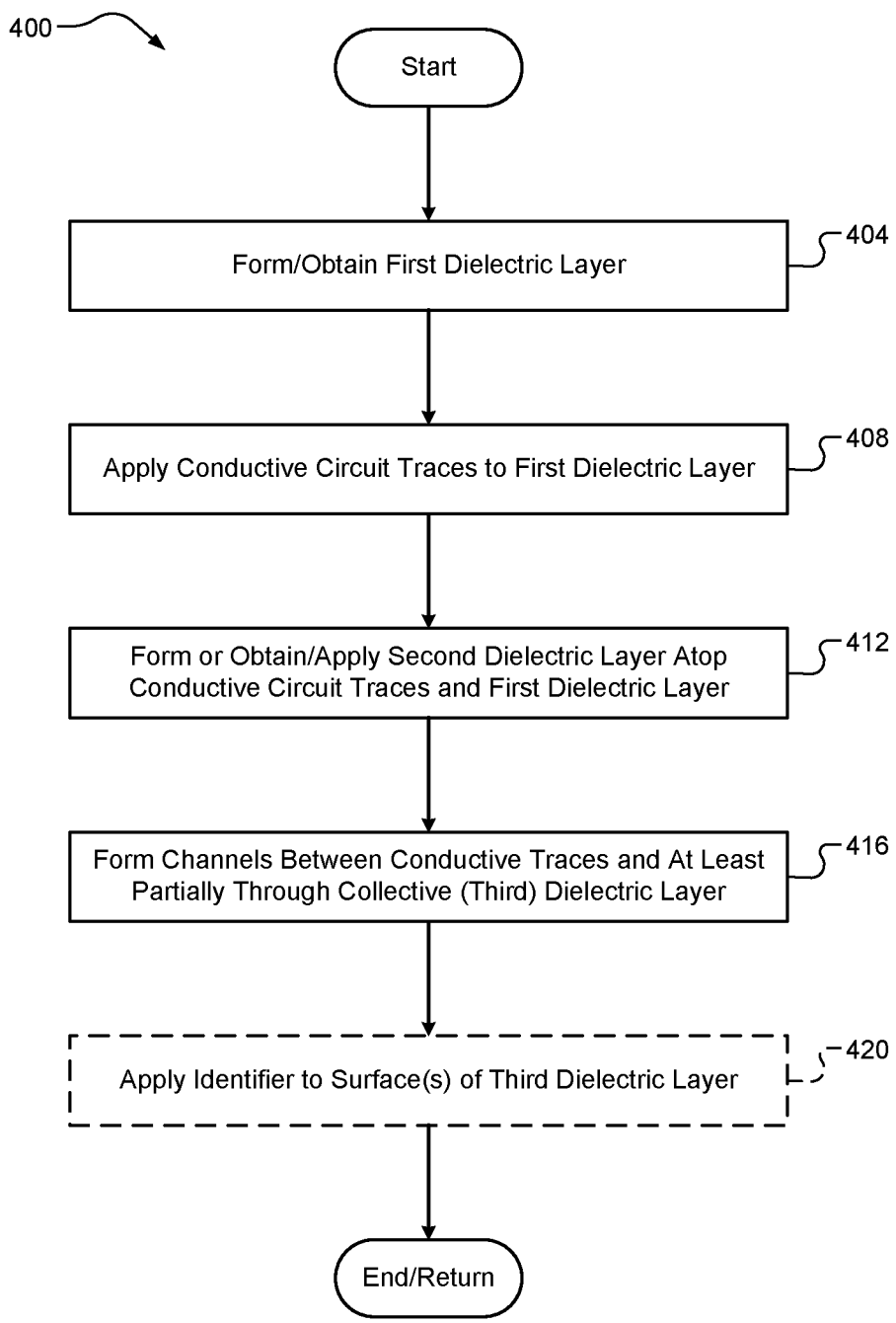
FIG. 4 illustrates a flow diagram of a method of forming an FC according to some implementations of the present disclosure.

Referring now to FIG. 4, a flow diagram of a method 400 of forming an FC according to some implementations of the present disclosure is illustrated. While not specifically referenced in describing method 400, it will be appreciated that the method 400 could be utilized to form any of the FCs 100, 200, 300 illustrated and described herein. At least some of the steps of method 400 could be performed by an injection molding system, a deposition or printing system, or laser processing system (e.g., a laser etcher), each of which could be controlled according to instructions executed by a respective controller or other suitable computing system. At step 404, a first dielectric layer is formed (e.g., using the injection molding system) or otherwise obtained. At step 408, a plurality of conductive circuit traces are applied to the first dielectric layer (e.g., using the deposition or printing system), wherein the plurality of conductive circuit traces are substantially parallel to each other. At step 412, a second dielectric layer is formed (e.g., using the injection molding system) or otherwise obtained and applied atop the first dielectric layer and the plurality of conductive circuit traces to form a third dielectric layer having the plurality of conductive traces disposed therein and being configured to support and insulate the plurality of conductive traces. At step 416, a plurality of channels are formed (e.g., using the laser system), wherein the plurality of channels extend at least partially through a thickness of the third dielectric layer and are arranged between the plurality of conductive circuit traces and substantially parallel thereto and are configured to provide increased flexibility of the FC. At optional step 420, an identifier is added to the FC (e.g., using the laser system) so as to identify its type and/or its installation location, e.g., for a human or robotic installer. The method 400 then ends or returns to step 404.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, the term module may refer to, be part of, or include: an Application Specific Integrated Circuit (ASIC); an electronic circuit; a combinational logic circuit; a field programmable gate array (FPGA); a processor or a distributed network of processors (shared, dedicated, or grouped) and storage in networked clusters or datacenters that executes code or a process; other suitable components that provide the described functionality; or a combination of some or all of the above, such as in a system-on-chip. The term module may also include memory (shared, dedicated, or grouped) that stores code executed by the one or more processors.

The term code, as used above, may include software, firmware, byte-code and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein, and any references to specific languages are provided for disclosure of enablement and best mode of the present invention.

The present disclosure is well suited to a wide variety of computer network systems over numerous topologies. Within this field, the configuration and management of large networks comprise storage devices and computers that are communicatively coupled to dissimilar computers and storage devices over a network, such as the Internet.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A flexible circuit (FC), comprising:
    a plurality of conductive circuit traces that are substantially parallel to each other; and
    an opaque dielectric layer:
        having the plurality of conductive circuit traces disposed therein;
        being configured to support and insulate the plurality of conductive circuit traces;
        having been laser-processed to such that the opaque dielectric layer:
            defines a plurality of laser-etched channels extending at least partially through a thickness of the opaque dielectric layer, wherein the plurality of laser-etched channels are arranged between the plurality of conductive circuit traces and substantially parallel thereto and are configured to provide increased flexibility of the FC; and
            defines a plurality of laser-etched identifiers defining at least (i) a type of the FC and (ii) an installation location for electrically connecting the FC to another electrical connector.

2. The FC of claim 1, wherein at least some of the plurality of laser-etched channels extend fully through the thickness of the opaque dielectric layer.

3. The FC of claim 2, wherein all of the plurality of laser-etched channels extend fully through the thickness of the opaque dielectric layer.

4. The FC of claim 1, wherein at least some of the plurality of laser-etched channels are discontinuous.

5. The FC of claim 4, wherein a discontinuity of the at least some of the plurality of laser-etched channels corresponds to a perforation pattern to provide for improved folding of the FC.

6. The FC of claim 4, wherein a discontinuity of the at least some of the plurality of laser-etched channels provides increased support or strength of the FC.

7. The FC of claim 1, wherein at least some of the plurality of conductive circuit traces are formed of copper or aluminum.

8. The FC of claim 1, wherein each of the plurality of laser-etched identifiers is a barcode or a quick response (QR) code that is scannable by a robot installer.

9. The FC of claim 1, wherein each of the plurality of laser-etched identifiers is a numerical code, an alphabetical code, or an alphanumerical code that is interpretable by at least one of a robotic installer a human installer.

10. The FC of claim 1, wherein the laser-etched identifier defining the installation location of the FC specifies its desired electrical connection to one or more other electrical connectors of an electrical system of a vehicle.

11. A method of forming a flexible circuit (FC), the method comprising:
    providing a first opaque dielectric layer;
    applying a plurality of conductive circuit traces that are substantially parallel to each other to the first opaque dielectric layer;
    providing a second opaque dielectric layer atop the first opaque dielectric layer and the plurality of conductive circuit traces to form a third opaque dielectric layer having the plurality of conductive traces disposed therein and being configured to support and insulate the plurality of conductive traces; and
    laser-processing the third opaque dielectric layer such that the third opaque dielectric layer defines:

a plurality of laser-etched channels extending at least partially through a thickness of the third opaque dielectric layer, wherein the plurality of laser-etched channels are arranged between the plurality of conductive circuit traces and substantially parallel thereto and are configured to provide increased flexibility of the FC; and a plurality of laser-etched identifiers defining at least (i) a type of the FC and (ii) an installation location for electrically connecting the FC to another electrical connector.

12. The method of claim 11, wherein at least some of the plurality of laser-etched channels extend fully through the thickness of the third opaque dielectric layer.

13. The method of claim 12, wherein all of the plurality of laser-etched channels extend fully through the thickness of the third opaque dielectric layer.

14. The method of claim 11, wherein at least some of the plurality of laser-etched channels are discontinuous.

15. The method of claim 14, wherein a discontinuity of the at least some of the plurality of laser-etched channels corresponds to a perforation pattern to provide for improved folding of the FC.

16. The method of claim 14, wherein a discontinuity of the at least some of the plurality of laser-etched channels provides increased support or strength of the FC.

17. The method of claim 11, wherein each of the plurality of laser-etched identifiers is a barcode or a quick response (QR) code that is scannable by a robot installer.

18. The method of claim 11, wherein each of the plurality of laser-etched identifiers is a numerical code, an alphabetical code, or an alphanumerical code that is interpretable by at least one of a robotic installer a human installer.

19. The method of claim 11, wherein the laser-etched identifier defining the installation location of the FC specifies its desired electrical connection to one or more other electrical connectors of an electrical system of a vehicle.

20. A method of manufacturing and installing a flexible circuit (FC) within an electrical system of a vehicle, the method comprising:

providing an FC comprising a plurality of conductive circuit traces disposed within an opaque dielectric layer;

performing a single laser processing procedure on the FC to:

laser-etch a plurality of channels into and extending at least partially through a thickness of the opaque dielectric layer, wherein the plurality of laser-etched channels are arranged between the plurality of conductive circuit traces and substantially parallel thereto; and laser-etch a plurality of identifiers defining at least (i) a type of the FC and (ii) an installation location for electrically connecting the FC to other electrical connectors within the vehicle electrical system, wherein the plurality of laser-etched identifiers include at least a barcode or quick-response (QR) code; and installing, by at least a robotic installer and a human installer, the FC within the vehicle electrical system in response to scanning of the barcode or QR code by the robotic installer.

* * * * *